United States Patent
Kishigami et al.

(10) Patent No.: US 9,130,522 B2
(45) Date of Patent: Sep. 8, 2015

(54) MATCHING DEVICE, TRANSMITTING AMPLIFIER, AND WIRELESS COMMUNICATION DEVICE

(71) Applicant: FUJITSU LIMITED, Kawasaki-shi, Kanagawa (JP)

(72) Inventors: Kazushige Kishigami, Sapporo (JP); Kenji Iwai, Chandler, AZ (US); Atsushi Kudo, Ishikari (JP); Nobuhide Hachiya, Sapporo (JP); Masahiko Hirao, Sapporo (JP)

(73) Assignee: FUJITSU LIMITED, Kawasaki (JP)

(*) Notice: Subject to any disclaimer, the term of this patent is extended or adjusted under 35 U.S.C. 154(b) by 120 days.

(21) Appl. No.: 13/954,178

(22) Filed: Jul. 30, 2013

(65) Prior Publication Data

US 2013/0316663 A1 Nov. 28, 2013

Related U.S. Application Data

(63) Continuation of application No. PCT/JP2011/051953, filed on Jan. 31, 2011.

(51) Int. Cl.
*H04B 1/44* (2006.01)
*H03F 3/68* (2006.01)
*H03H 7/40* (2006.01)
(Continued)

(52) U.S. Cl.
CPC .. *H03F 3/68* (2013.01); *H03F 3/24* (2013.01); *H03F 3/72* (2013.01); *H03H 7/40* (2013.01); *H04B 1/0458* (2013.01); *H04B 1/44* (2013.01); *H03F 2200/111* (2013.01); *H03F 2203/7209* (2013.01); *H03F 2203/7221* (2013.01); *H03H 2007/386* (2013.01)

(58) Field of Classification Search
CPC .................................................. H04B 1/0458
See application file for complete search history.

(56) References Cited

U.S. PATENT DOCUMENTS 5,973,557 A 10/1999 Miyaji et al.
5,973,568 A 10/1999 Shapiro et al.
(Continued)

FOREIGN PATENT DOCUMENTS

JP 10-190379 7/1998
JP 11-097946 4/1999
(Continued)

OTHER PUBLICATIONS

EESR—Supplementary European Search Report issued for European Patent Application No. 11857651.1, dated Jul. 7, 2014.
(Continued)

*Primary Examiner* — Andrew Wendell
*Assistant Examiner* — Cindy Trandai
(74) *Attorney, Agent, or Firm* — Fujitsu Patent Center

(57) ABSTRACT

A first signal path has one or a plurality of coils arranged in series, the coils being connected to the output of a first amplifier. A second signal path has the same number of coils as the coils of the first signal path, the coils being arranged in series and connected to the output of a second amplifier. Coupling paths have capacitors and couple the first signal path and the second signal path at both ends of the corresponding coils on the first signal path and the second signal path. A SW controlling unit switches a switch to a contact when a signal is input from the first amplifier and switches the switch to a contact when a signal is input from the second amplifier.

7 Claims, 10 Drawing Sheets

(51) Int. Cl.
*H04B 1/04* (2006.01)
*H03F 3/24* (2006.01)
*H03F 3/72* (2006.01)
*H03H 7/38* (2006.01)

(56) References Cited

U.S. PATENT DOCUMENTS

| 2002/0021169 | A1* | 2/2002 | King et al. ................... 330/51 |
| 2002/0101907 | A1 | 8/2002 | Dent et al. |
| 2006/0261911 | A1 | 11/2006 | Fukuda et al. |
| 2007/0018720 | A1* | 1/2007 | Wright ........................ 330/51 |
| 2008/0136559 | A1 | 6/2008 | Takahashi et al. |
| 2009/0167458 | A1 | 7/2009 | Fukuda et al. |
| 2009/0179711 | A1 | 7/2009 | Fukuda et al. |
| 2010/0295629 | A1* | 11/2010 | Klemens et al. ............ 333/126 |
| 2010/0308933 | A1* | 12/2010 | See et al. .................... 333/32 |
| 2011/0018632 | A1* | 1/2011 | Pletcher et al. ............ 330/192 |
| 2011/0032035 | A1* | 2/2011 | Pletcher et al. ............ 330/277 |
| 2012/0126891 | A1* | 5/2012 | Kim et al. ................. 330/124 R |

FOREIGN PATENT DOCUMENTS

| JP | 2004-180135 | 6/2004 |
| JP | 2006-325153 | 11/2006 |

OTHER PUBLICATIONS

Ghajar M R et al: "Concurrent dual band 2.4/3.5Ghz fully integrated power amplifier in 0.13Â [mu]m CMOS technology", Microwave Conference, 2009. EUMC 2009. European, IEE, Piscataway, NJ, USA, Sep. 29, 2009, pp. 1728-1731, XP031670134.

International Search Report, mailed in connection with PCT/JP2011/051953 and mailed Mar. 15, 2011.

* cited by examiner

| BAND | VARIABLE CAPACITANCE ELEMENT APPLIED VOLTAGE | CAPACITANCE VALUE | SMITH CHART |
|---|---|---|---|
| I | 1.0 (V) | A | $\alpha$ |
| DCS/PCS | 1.5 (V) | B | $\beta$ |
| IX | 2.0 (V) | C | $\gamma$ |

MATCHING DEVICE, TRANSMITTING AMPLIFIER, AND WIRELESS COMMUNICATION DEVICE

CROSS-REFERENCE TO RELATED APPLICATION

This application is continuation application of International Application PCT/JP2011/051953 filed on Jan. 31, 2011 and designating the U.S., the entire contents of which are incorporated herein by reference.

FIELD

The present invention relates to a matching device, a transmitting amplifier, and a wireless communication device.

BACKGROUND

In recent years, next-generation communication methods such as the long-term evolution (LTE) have been considered to be used for cellular phones, in addition to conventional methods such as the wideband-code division multiple access (W-CDMA) and the global system for mobile communications (GSM). The next-generation communication methods such as LTE are global standard specifications. Given this situation, a frequency configuration in wireless communications is being reviewed in various countries.

Cellular phone operators that provide cellular phone communications service use an increasing number of frequency bands (hereinafter, may be called bands) to accommodate the communications methods. Because this increases the number of bands that cellular phones need to deal with, a wireless block in cellular phones is designed with a markedly increasing number of wireless parts.

A few years ago, cellular phones only needed to have one band, but recent cellular phones deal with many bands such as Band I/V/IX, GSM850/900, and the digital cellular system (DCS)/the personal communications service (PCS). For example, the band of Band V is 824 to 849 MHz. The band of GSM850/900 is 824 to 915 MHz. For example, the band of Band I is 1920 to 1980 MHz. For example, the band of Band IX is 1750 to 1785 MHz. For example, the band of DCS/PCS is 1710 to 1910 MHz. Band V and GSM850/900, which have relatively low bands, are called LowBand. Band I, Band IX, and DCS/PCS, which have relatively high bands, are called HighBand.

In order to suppress the increase in the number of wireless parts caused by such an increase in the bands used, techniques for packaging GSM and for packaging two or more bands in W-CDMA in a transmitting amplifier have been developed. A multi-band/multi-mode power amplifier (PA) technique for amplifying both the communication methods of W-CDMA and GSM has also been developed.

Generally in the multi-band configuration, signals are collectively handled for bands in LowBand (824 to 915 MHz) and for bands in HighBand (1750 to 1980 MHz). In this case, two amplifiers are used for amplifying signals at the LowBand side and for amplifying signals at the HighBand side. To distribute output from the amplifiers to each band, a "2 in 5 out" configuration has been designed to include switches at the output sides of the amplifiers.

In such a multi-band configuration, a conventional technique has been developed in which output matching to a desired frequency is performed with a switch to switch among the outputs of the two transmitting amplifiers and the ground. Another conventional technique has been developed in which input-stage matching circuits are integrated.

Patent Literature 1: Japanese Patent Application Laid-open No. 2004-180135
Patent Literature 2: Japanese Patent Application Laid-open No. 10-190379

SUMMARY

In a transmitting amplifier, in general, matching is difficult because signal amplification is complete and power is high in the output side matching circuit, which is the final-stage matching circuit. In both the conventional technique in which the outputs of the two transmitting amplifiers and the ground are switched with a switch and the conventional technique in which input-stage matching circuits are integrated, therefore, the final-stage matching circuit employs two independent matching circuits at the HighBand side and the LowBand side.

Because matching requires many matching elements, such as coils (L) and capacitors (C), to achieve a wide range of bands, each matching circuit increases in size, impeding miniaturization.

A matching device includes: a first signal path that has one or a plurality of first matching elements arranged in series, the first matching elements being connected to the output of a first amplifier; a second signal path that has the same number of second matching elements as the first matching elements, the second matching elements having the same type of reactance as the first matching elements and being arranged in series and connected to the output of a second amplifier; a plurality of coupling paths that have third matching elements having a different type of reactance from the first matching elements and couple the first signal path and the second signal path at both ends of the respective first matching elements on the first signal path and of the corresponding second matching elements on the second signal path; a switch that switches connection of the first signal path to an antenna or the ground and switches connection of the second signal path to an antenna or the ground; and a switch controlling unit that controls the switch so as to connect the second signal path to the ground when a signal is input from the first amplifier and that controls the switch so as to connect the first signal path to the ground when a signal is input from the second amplifier.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Hereinafter, embodiments of a matching device, a transmitting amplifier, and a wireless communication device disclosed by the present invention will be described in detail with reference to the drawings. The matching device, the transmitting amplifier, and the wireless communication device disclosed by the present invention are not limited by the following embodiments.

[a] First Embodiment

Figure 1:
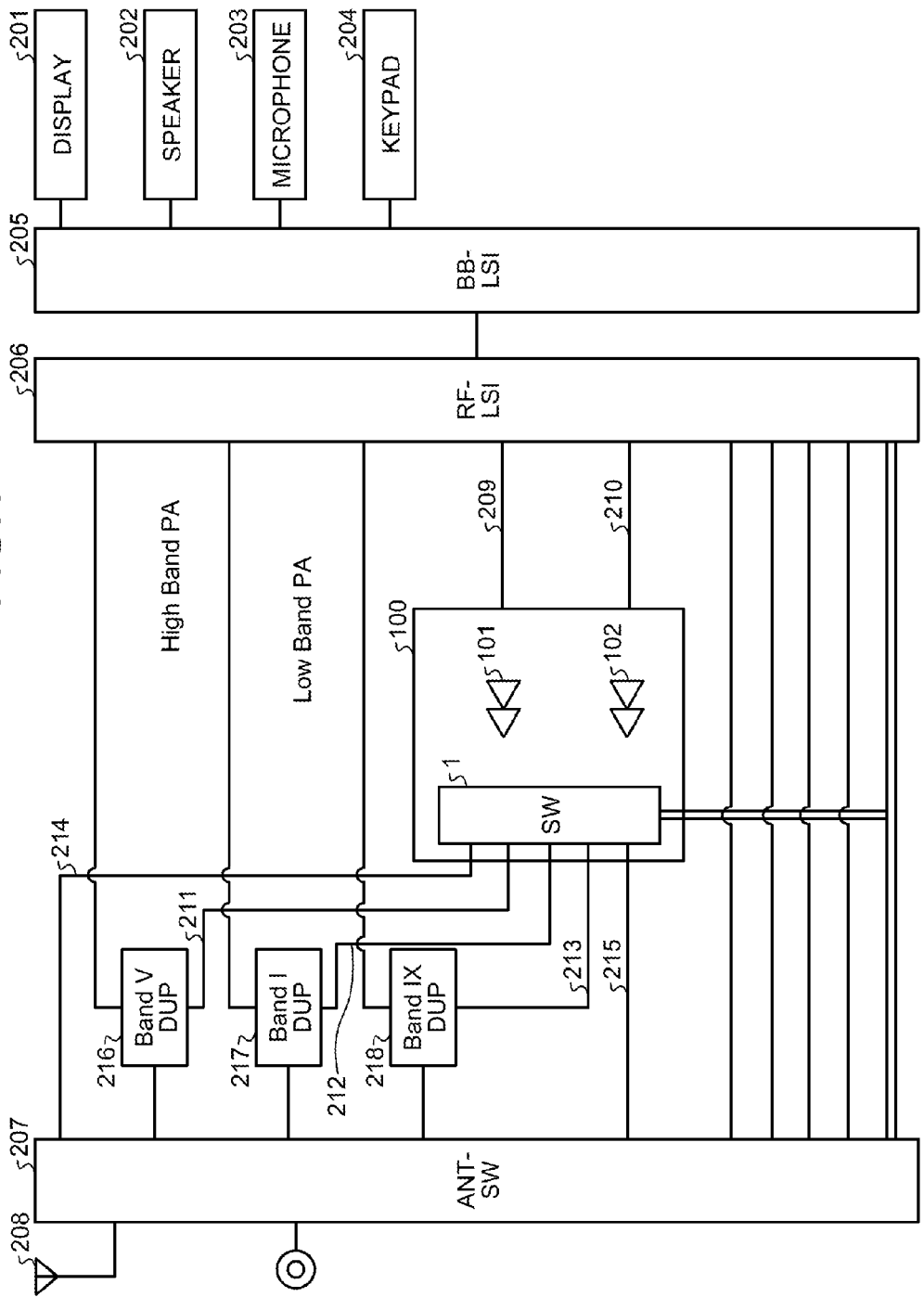
FIG. 1 is a block diagram illustrating the entire configuration of a wireless communication device.

FIG. 1 is a block diagram illustrating the entire configuration of a wireless communication device. This wireless communication device according to the present embodiment includes a display 201, a speaker 202, a microphone 203, and a keypad 204. The wireless communication device also includes a transmitting amplifier 100, a base band-large scale integration (BB-LSI) 205, a radio frequency (RF)-LSI 206, an antenna-switch (ANT-SW) 207, and an antenna 208. The wireless communication device further includes a Band V duplexer (DUP) 216, a Band I DUP 217, and a Band IX DUP 218.

The entire flow of the transmission and reception of a signal in the wireless communication device will be described. An operator inputs a voice by using the microphone 203 or inputs data using the keypad 204 while referring to the display 201. The BB-LSI 205 converts the input voice and data into a baseband signal. This BB-LSI 205 is an example of a baseband signal generating unit. The RF-LSI 206 converts the baseband signal into a wireless signal. The RF-LSI 206 outputs the wireless signal to the transmitting amplifier 100. This RF-LSI 206 is an example of a wireless signal generating unit. A wireless signal whose band is any of Band I, Band IX, or DCS/PCS is sent to the transmitting amplifier 100 through a signal path 209. A wireless signal whose band is either of Band V or GSM850/900 is sent to the transmitting amplifier 100 through a signal path 210.

The transmitting amplifier 100 includes a HighBand PA 101, a LowBand PA 102, and a switch (SW) 1. The switch, which is denoted by SW in FIG. 1, may be called the switch 1 hereinafter. This transmitting amplifier 100 will be described in detail later. The transmitting amplifier 100 receives the input of the wireless signal from the RF-LSI 206. In accordance with the band (frequency band) of the input wireless signal, the transmitting amplifier 100 amplifies the signal using either of the amplifiers. For example, the transmitting amplifier 100 uses the HighBand PA 101 for the wireless signal whose band is any of Band I, Band IX, or DCS/PCS. The transmitting amplifier 100 uses the LowBand PA 102 for the wireless signal whose band is either of Band V or GSM850/900. The transmitting amplifier 100 switches the switch 1 so as to output the wireless signal to an output path corresponding to the band of the wireless signal. The transmitting amplifier 100 then outputs the wireless signal to the output path corresponding to the band of the wireless signal. The wireless signal whose band is Band V is sent to the BandV DUP 216 through a signal path 211. The wireless signal whose band is Band I is sent to the BandI DUP 217 through a signal path 212. The wireless signal whose band is Band IX is sent to the BandIX DUP 218 through a signal path 213. The wireless signal whose band is GSM850/900 is sent to the ANT-SW 207 through a signal path 214. The wireless signal whose band is DCS/PCS is sent to the ANT-SW 207 through a signal path 215.

The BandV DUP 216, the BandI DUP 217, and the BandIX DUP 218 are antenna duplexers that share one antenna for the transmission and reception of wireless signals having corresponding bands and branch transmission signals and reception signals.

The BandV DUP 216 receives the input of the wireless signal having a band of Band V from the transmitting amplifier 100. Upon reception of the signal from the transmitting amplifier 100, the BandV DUP 216 switches its path to the transmission side. The BandV DUP 216 then performs frequency band limitation on the received wireless signal and outputs it to the ANT-SW 207. The BandI DUP 217 receives the input of the wireless signal having a band of Band I from the transmitting amplifier 100. Upon reception of the signal from the transmitting amplifier 100, the BandI DUP 217 switches its path to the transmission side. The BandI DUP 217 then performs frequency band limitation on the received wireless signal and outputs it to the ANT-SW 207. The BandIX DUP 218 receives the input of the wireless signal having a band of Band IX from the transmitting amplifier 100. Upon reception of the signal from the transmitting amplifier 100, the BandIX DUP 218 switches its path to the transmission side. The BandIX DUP 218 then performs frequency band limitation on the received wireless signal and outputs it to the ANT-SW 207. Because the band limitation differs from band to band, the duplexer has to be different for each band.

The ANT-SW 207 switches the connection between the antenna and the other parts in accordance with a transmission signal or a reception signal. Upon reception of a signal from the BandV DUP 216, the BandI DUP 217, or the BandIX DUP 218, the ANT-SW 207 outputs the wireless signal through the antenna 208. Upon reception of the wireless signal whose band is GSM850/900 or DCS/PCS through the signal path 214 or the signal path 215, the ANT-SW 207 switches the switch to the transmission side and transmits the wireless signal through the antenna 208. The BandV DUP 216, the BandI DUP 217, the BandIX DUP 218, and the ANT-SW 207 are examples of a transmitting unit.

Figure 2:
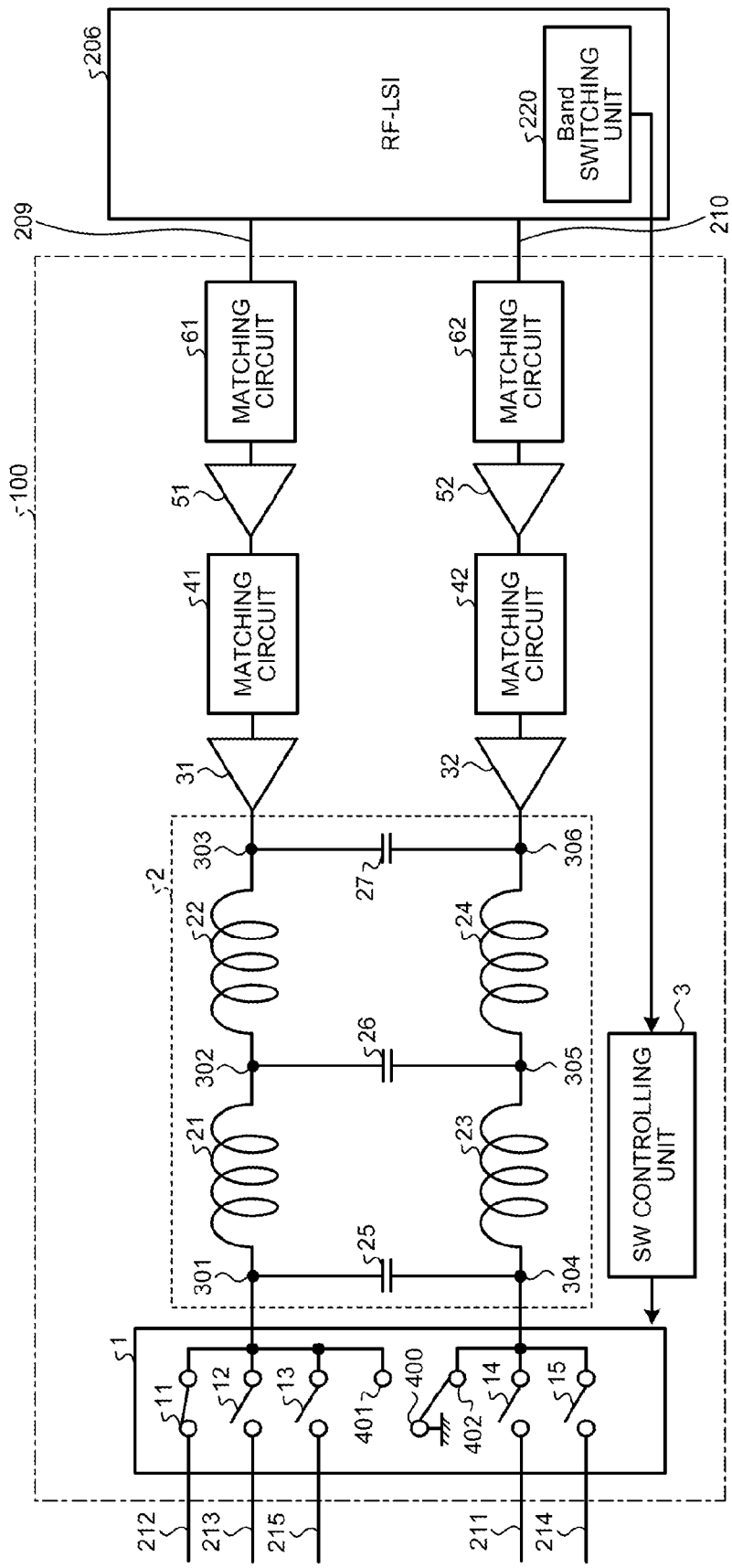
FIG. 2 is a block diagram of a transmitting amplifier according to a first embodiment.

FIG. 2 is a block diagram of a transmitting amplifier according to the present embodiment. For example, the part surrounded by the dashed line indicates the transmitting amplifier 100. FIG. 2 illustrates the transmitting amplifier 100 of FIG. 1 in more detail.

The transmitting amplifier 100, as illustrated in FIG. 2, includes the switch 1, a matching circuit 2, a SW controlling unit 3, amplifiers 31 and 32, matching circuits 41 and 42, amplifiers 51 and 52, and matching circuits 61 and 62. The combination of the amplifier 31 and the amplifier 51 corresponds to the HighBand PA 101 of FIG. 1. The combination of the amplifier 32 and the amplifier 52 corresponds to the LowBand PA 102 of FIG. 1. The matching circuit 2 is an output side matching circuit, that is, a final-stage matching circuit. The switch 1, the matching circuit 2, and the SW controlling unit 3 are examples of a matching device. The RF-LSI 206 includes a band switching unit 220.

The RF-LSI 206 converts the baseband signal received from the BB-LSI 205 into a wireless signal and determines the band of the wireless signal. The RF-LSI 206 sends the wireless signal whose band is any of Band I, Band IX, or DCS/PCS to the transmitting amplifier 100 through the signal path 209. The RF-LSI 206 sends the wireless signal whose band is either of Band V or GSM850/900 to the transmitting amplifier 100 through the signal path 210.

The band switching unit 220 transmits a switching execution instruction in accordance with the band of the wireless signal transmitted to the transmitting amplifier 100 to the SW controlling unit 3. For example, when the band of the output wireless signal is Band I, the band switching unit 220 transmits an instruction for executing switching so as to output the wireless signal having a band of Band I, to the SW controlling unit 3.

The matching circuit 61 matches the input from the amplifier 51 to improve the properties of the amplifier 51. To improve the properties of an amplifier includes adjustment to maximize a gain by taking power, voltage, distortion, or the like into account. The matching circuit 61 receives the input of the wireless signal whose band is any of Band I, Band IX, or DCS/PCS through the signal path 209 from the RF-LSI 206. The matching circuit 61 then outputs the signal to the amplifier 51.

The matching circuit 62 matches the input from the amplifier 52 to improve the properties of the amplifier 52. The matching circuit 62 receives the input of the wireless signal whose band is either of Band V or GSM850/900 through the signal path 210 from the RF-LSI 206. The matching circuit 62 then outputs the signal to the amplifier 52.

The amplifier 51 receives the input of the signal from the matching circuit 61. The amplifier 51 amplifies the received signal. The amplifier 51 then outputs the amplified signal to the matching circuit 41. This amplifier 51 is an example of a third amplifier.

The amplifier 52 receives the input of the signal from the matching circuit 62. The amplifier 52 amplifies the received signal. The amplifier 52 then outputs the amplified signal to the matching circuit 42. This amplifier 52 is an example of a fourth amplifier.

The matching circuit 41 performs the matching between the output from the amplifier 51 and the input to the amplifier 31 to improve the properties of the amplifier 51 and the amplifier 31. The matching circuit 41 receives the input of the amplified signal from the amplifier 51. The matching circuit 41 then outputs the signal to the amplifier 31.

The matching circuit 42 performs the matching between the output from the amplifier 52 and the input to the amplifier 32 to improve the properties of the amplifier 52 and the amplifier 32. The matching circuit 42 receives the input of the amplified signal from the amplifier 52. The matching circuit 42 then outputs the signal to the amplifier 32.

The amplifier 31 receives the input of the signal from the matching circuit 41. The amplifier 31 amplifies the received signal. The amplifier 31 then outputs the amplified signal to the matching circuit 2. This amplifier 31 is an example of a first amplifier.

The amplifier 32 receives the input of the signal from the matching circuit 42. The amplifier 32 amplifies the received signal. The amplifier 32 then outputs the amplified signal to the matching circuit 2. This amplifier 32 is an example of a second amplifier.

The switch 1 includes a switch 11, a switch 12, a switch 13, a switch 14, a switch 15, and a switch 400. The switches 11 to 15 are turned on and off through contacting with and leaving from the contacts. The switch 400 connects a contact 401 to the ground by switching to the contact 401, and connects a contact 402 to the ground by switching to the contact 402. Connecting the contact 401 to the ground is equivalent to connecting connecting points 301 to 303 to the ground. Connecting the contact 402 to the ground is equivalent to connecting connecting points 304 to 306 to the ground.

The SW controlling unit 3 receives a switching execution instruction in accordance with the band of the input signal, from the band switching unit 220 to turn on and off the switches 11 to 15 in the switch 1 and switch the switch 400. The SW controlling unit 3 is an example of a switch controlling unit.

For example, if a signal having a band of Band I is input, the SW controlling unit 3 turns on the switch 11 to switch the switch 400 to the contact 402 side. Furthermore, the SW controlling unit 3 turns off the switches 12, 13, 14, and 15. If a signal having a band of Band IX is input, the SW controlling unit 3 turns on the switch 12 to switch the switch 400 to the contact 402 side. Furthermore, the SW controlling unit 3 turns off the switches 11, 12, 14, and 15. If a signal having a band of DCS/PCS is input, the SW controlling unit 3 turns on the switch 13 to switch the switch 400 to the contact 402 side. Furthermore, the SW controlling unit 3 turns off the switches 11, 12, 14, and 15. IF a signal having a band of Band V is input, the SW controlling unit 3 turns on the switch 14 to switch the switch 400 to the contact 401 side. Furthermore, the SW controlling unit 3 turns off the switches 11, 12, 13, and 15. If a signal having a band of is GSM850/900 input, the SW controlling unit 3 turns on the switch 15 to switch the switch 400 to the contact 401 side. Furthermore, the SW controlling unit 3 turns off the switches 11, 12, 13, and 14.

The matching circuit 2, as illustrated in FIG. 2, includes coils 21 to 24 and capacitors 25 to 27. The coil 21 and the coil 22 are arranged in series to connect the amplifier 31 and the switch 1. This path connecting the amplifier 31 and the switch 1 including the coil 21 and the coil 22 is an example of a first signal path. The coil 23 and the coil 24 are arranged in series to connect the amplifier 32 and the switch 1. This path connecting the amplifier 32 and the switch 1 including the coil 23 and the coil 24 is an example of a second signal path. The coil 21 and the coil 22 are examples of first matching elements. The coil 23 and the coil 24 are examples of second matching elements. The coil 23 and the coil 24 are examples of a matching element having the same type of reactance with the coil 21 and the coil 22.

The connecting point 301 is positioned at the left-hand end of the coil 21 in the drawing. The connecting point 302 is positioned at the right-hand end of the coil 21 in the drawing, i.e., at the left-hand end of the coil 22 in the drawing. The connecting point 303 is positioned at the right-hand end of the coil 22 in the drawing. A connecting point 304 is positioned at the left-hand end of the coil 23 in the drawing. A connecting point 305 is positioned at the right-hand end of the coil 23 in the drawing, i.e., at the left-hand end of the coil 24 in the drawing. A connecting point 306 is positioned at the right-hand end of the coil 24 in the drawing. The connecting point 301 and the connecting point 304 are connected through the capacitor 25. The connecting point 302 and the connecting point 305 are connected through the capacitor 26. Furthermore, the connecting point 303 and the connecting point 306 are connected through the capacitor 27. These connecting points 301 to 306 correspond to both side positions of the first matching elements. The path coupling the connecting points 301 to 303 and the path coupling the connecting points 304 to 306 are examples of coupling paths. The capacitors 25 to 27 are examples of third matching elements. The capacitors 25 to 27 are examples of matching elements having a different type of reactance from the coil 21 and the coil 22.

Figure 3:
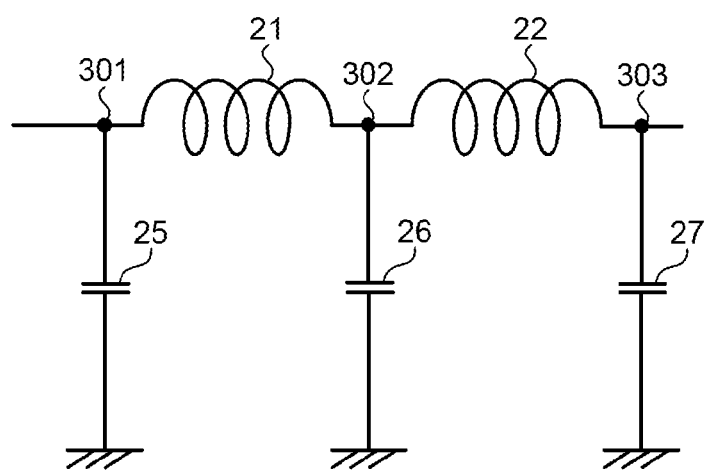
FIG. 3 is a diagram for describing a state of a matching circuit 2 when connecting points 304 to 306 are considered to be connected to the ground.

How to determine the inductance of the coils 21 to 24 and the capacitance of the capacitors 25 to 27 will be described. The impedance of the coils 21 and 22 and the capacitors 25 to 27 is determined so that the output from the amplifier 31 can be matched in a case when the connecting points 304 to 306 are essentially connected to the ground. The case when the connecting points 304 to 306 are essentially connected to the ground is a case with a connection as in FIG. 3. FIG. 3 is a diagram illustrating a state of the matching circuit 2 when the connecting points 304 to 306 are essentially connected to the ground. The impedance of the coils 23 and 24 and the capacitors 25 to 27 is determined so that the output from the amplifier 32 can be matched when the connecting points 301 to 302 are essentially connected to the ground. The ratio of the coils 21 to 24 to the capacitors 25 to 27 is determined to satisfy the respective set impedances.

As an example of the HighBand's side, a case in which a signal having a band of Band I is input will be described. If the signal having a band of Band I is input, as described above, in the switch 1, the switch 11 is turned on, the switch 400 is switched to the contact 402 side, and the switches 12, 13, 14, and 15 are turned off.

The signal having a band of Band I is transmitted from the amplifier 31 toward the connecting point 303. In this situation, because the connecting point 304, the connecting point 305, and the connecting point 306 are essentially connected to the ground, the matching circuit 2 can be used as a matching circuit with the configuration of a general matching circuit like the one illustrated in FIG. 3. The matching circuit 2, using the coils 21 and 22 and the capacitors 25 to 27, matches the output from the amplifier 31 to improve the properties of the amplifier 31. The matching circuit 2 then sends the signal having a band of Band I to the switch 1. In this case, because the switch 11 is turned on, the signal of Band I sent from the matching circuit 2 is output to the signal path 212 through the switch 11.

As an example of the LowBand's side, a case in which a signal having a band of Band V is input will be described. If the signal having a band of Band V is input, as described above, in the switch 1, the switch 14 is turned on, the switch 400 is switched to the contact 401 side, and the switches 11, 12, 13, and 15 are turned off.

The signal having a band of Band V is transmitted from the amplifier 32 toward the connecting point 306. In this situation, the connecting point 301, the connecting point 302, and the connecting point 303 are essentially connected to the ground. The matching circuit 2, using the coils 23 and 24 and the capacitors 25 to 27, matches the output from the amplifier 32 to improve the properties of the amplifier 32. The matching circuit 2 then sends the matched signal having a band of Band V to the switch 1. In this case, because the switch 14 is turned on, the signal of Band V sent from the matching circuit 2 is output to the signal path 211 through the switch 14.

The matching circuit 2 and the switch 1 are examples of a matching circuit.

Figure 4:
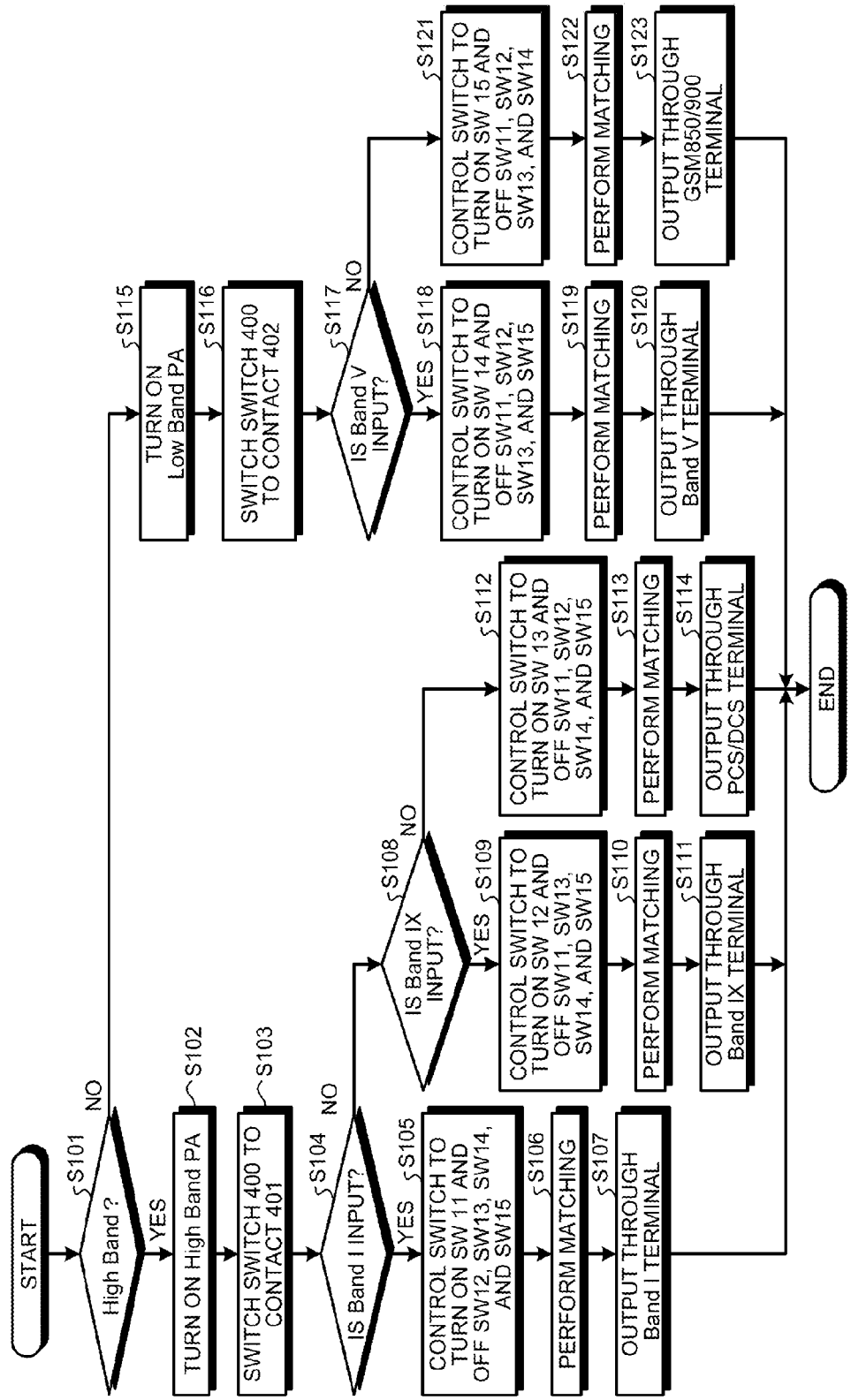
FIG. 4 is a flowchart illustrating the operation of the transmitting amplifier according to the first embodiment during signal transmission.

Next, with reference to FIG. 4, the operation of a transmitting amplifier according to the present invention during signal transmission will be described. FIG. 4 is a flowchart illustrating the operation of the transmitting amplifier according to the present invention during signal transmission.

The RF-LSI 206 determines whether the band of the input wireless signal is High Band (Step S101). If it is HighBand (Yes at Step S101), the matching circuit 2 turns on the High-Band PA 101 (Step S102).

The SW controlling unit 3 then receives the switching execution instruction for the signal having any band of Band I, Band IX, or PCS/DCS from the band switching unit 220 and switches the switch 400 to the contact 401 (Step S103).

Furthermore, the SW controlling unit 3 determines whether the signal having a band of Band I is input (Step S104). If the signal having a band of Band I is input (Yes at Step S104), the SW controlling unit 3 controls the switch 1 so that the switch 11 is turned on and that the switches 12 to 15 are turned off (Step S105).

The matching circuit 2, using the coils 21 and 22 and the capacitors 25 to 27, matches the output from the amplifier 31 (Step S106).

The switch 1 outputs the signal having a band of Band I output from the matching circuit 2 through a Band I terminal connecting to the signal path 212 (Step S107).

In contrast, if the signal having a band of Band I is not input (No at Step S104), the SW controlling unit 3 determines whether the signal having a band of Band IX is input (Step S108). IF the signal having a band of Band IX is input (Yes at Step S108), the SW controlling unit 3 controls the switch 1 so that the switch 12 is turned on and that the switches 13 to 15 are turned off (Step S109).

The matching circuit 2, using the coils 21 and 22 and the capacitors 25 to 27, matches the output from the amplifier 31 (Step S110).

The switch 1 outputs the signal having a band of Band IX output from the matching circuit 2 through a Band IX terminal connecting to the signal path 213 (Step S111).

In contrast, if the signal having a band of Band IX is not input (No at Step S108), the SW controlling unit 3 controls the switch 1 so that the switch 13 is turned on and that the switches 11, 12, 14, and 15 are turned off (Step S112).

The matching circuit 2, using the coils 21 and 22 and the capacitors 25 to 27, matches the output from the amplifier 31 (Step S113).

The switch 1 outputs the signal having a band of Band DCS/PCS output from the matching circuit 2 through a DCS/PCS terminal connecting to the signal path 215 (Step S114).

In contrast, if not HighBand (No at Step S101), the matching circuit 2 turns on the Low Band PA 102 (Step S115).

The SW controlling unit 3 receives the switching execution instruction for the signal having either band of Band V or GSM850/900 from the band switching unit 220 and switches the switch 400 to the contact 402 (Step S116).

Furthermore, the SW controlling unit 3 determines whether the signal having a band of Band V is input (Step S117). If the signal having a band of Band V is input (Yes at Step S117), the SW controlling unit 3 controls the switch 1 so that the switch 14 is turned on and that the switches 11 to 13 and 15 are turned off (Step S118).

The matching circuit 2, using the coils 23 and 24 and the capacitors 25 to 27, matches the output from the amplifier 32 (Step S119).

The switch 1 outputs the signal having a band of Band V output from the matching circuit 2 through a Band V terminal connecting to the signal path 211 (Step S120).

In contrast, if the signal having a band of Band V is not input (No at Step S117), the SW controlling unit 3 controls the switch 1 so that the switch 15 is turned on and that the switches 11 to 14 are turned off (Step S121).

The matching circuit 2, using the coils 23 and 24 and the capacitors 25 to 27, matches the output from the amplifier 32 (Step S122).

The switch 1 outputs the signal having a band of GSM850/900 output from the matching circuit 2 through a GSM850/900 terminal connecting to the signal path 214 (Step S123).

As described above, the final-stage matching circuit of the transmitting amplifier according to the present embodiment is a circuit in which the matching circuit for the signal of High-Band and the matching circuit for the signal of LowBand are integrated. This reduces the number of matching elements for performing matching and reduces the size of the matching circuit. The use of this matching circuit therefore reduces the size of the transmitting amplifier and contributes to the miniaturization of wireless communication terminals such as cellular phones.

(Modification)

Figure 5:
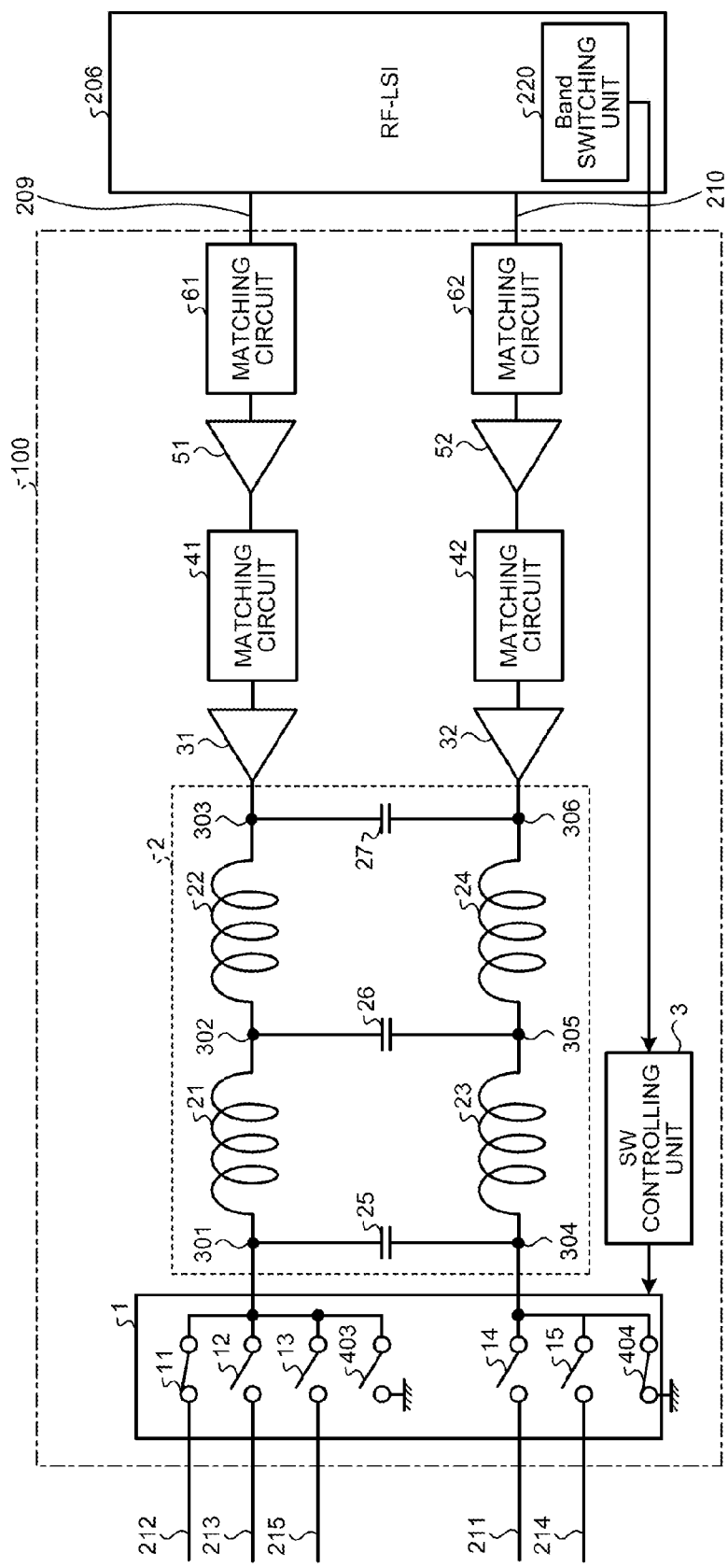
FIG. 5 is a block diagram of a transmitting amplifier according to a modification of the first embodiment.

Next, a modification of the transmitting amplifier according to the first embodiment will be described. FIG. 5 is a block diagram of a transmitting amplifier according to the modification of the first embodiment. The transmitting amplifier according to the present modification is different from the first embodiment in the configuration of the switch 1. In FIG. 5, the parts having the same reference signs as those of FIG. 1 are regarded to have the same functions unless otherwise described.

The switch 1 in the transmitting amplifier 100 according to the present modification includes a switch 403 and a switch 404 in place of the switch 400, the contact 401, and the contact 402 of the first embodiment. The switch 403 is connected to the ground through the connection with a contact. The switch 404 is connected to the ground through connection with a contact. In other words, the switch 403 and the switch 404 are two switches obtained by dividing the switch 400 of the first embodiment into two.

In the present modification, if the signal of HighBand is input, the switch 404 is turned on and connected to the ground, and the switch 403 is turned off. If the signal of LowBand is input, the switch 403 is turned on and connected to the ground, and the switch 404 is turned off. This allows the transmitting amplifier 100 according to the present embodiment to operate in the same manner as in the first embodiment.

The switch according to the present modification increases in size to the extent that it includes two switches, as compared to the first embodiment. However, also in the present modification, the final-stage matching circuit is integrated for HighBand and LowBand. This reduces the transmitting amplifier in size as compared to a case having two independent final-stage matching circuits that are matching circuits for HighBand and a matching circuit for LowBand. If there is space to accommodate a little increase in the switch size, the switch for grounding may be divided into two.

[b] Second Embodiment

Figure 6:
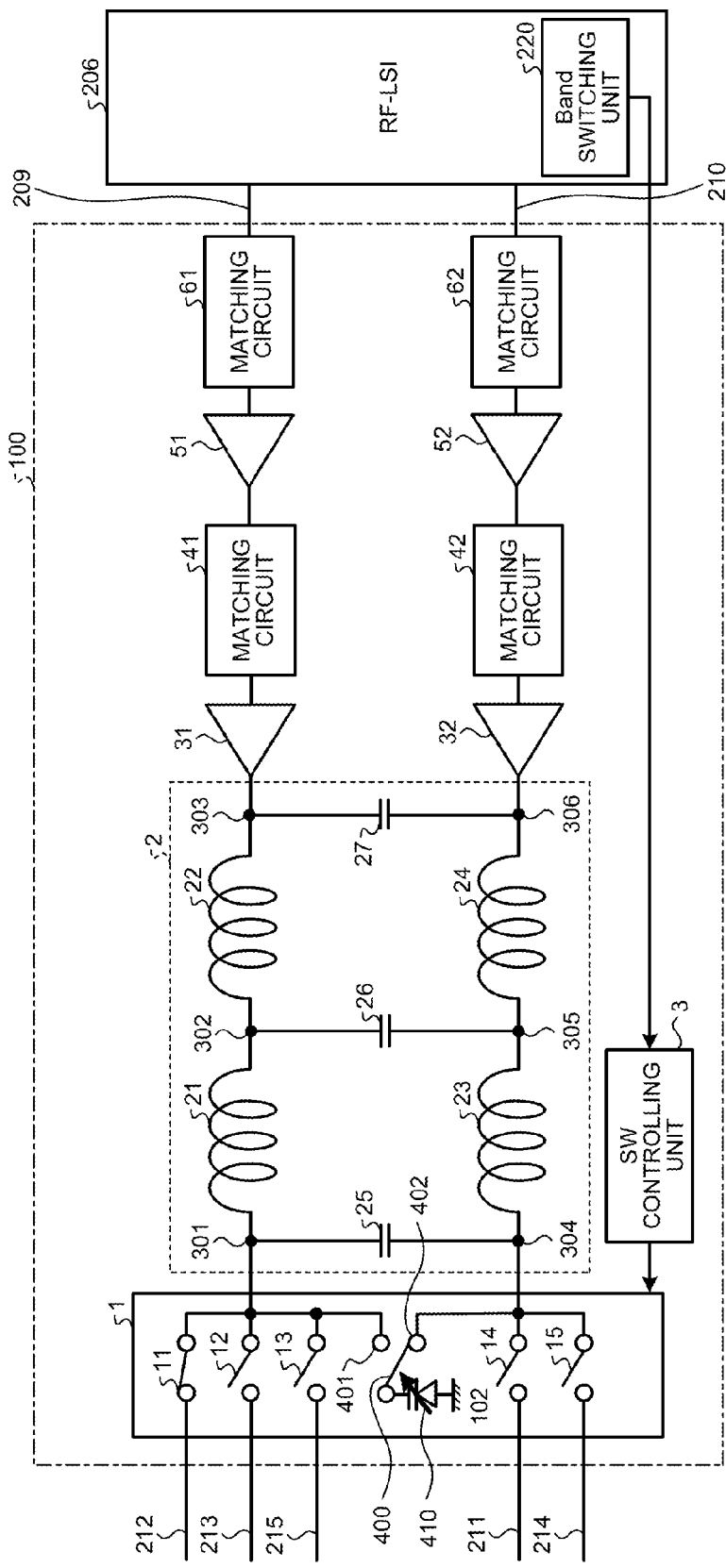
FIG. 6 is a block diagram of a transmitting amplifier according to a second embodiment.

FIG. 6 is a block diagram of a transmitting amplifier according to a second embodiment. The transmitting amplifier according to the present embodiment is different from the first embodiment in that a variable capacitor 410 is located between the switch 400 and the ground. Hereinafter then, the operation of the variable capacitor 410 will be mainly described. In FIG. 6, the parts having the same reference signs as those of FIG. 1 are regarded to have the same functions unless otherwise described.

The variable capacitor 410 is, as illustrated in FIG. 6, is located between the switch 400 and the ground. This variable capacitor 410 is an example of a variable capacitance element.

The SW controlling unit 3 stores therein the capacitances of the variable capacitor 410 corresponding to the respective bands. For example, the capacitances of the variable capacitor 410 corresponding to the respective bands are determined so that the output from the amplifier 31 can be matched when any of Band I, IX, or DCS/PCS is input with the connecting points 304 to 306 connected to the ground. The capacitances of the variable capacitor 410 corresponding to the respective bands are determined so that the output from the amplifier 32 can be matched when either of Band V or GSM850/900 is input with the connecting points 301 to 303 connected to the ground. The SW controlling unit 3 stores therein the determined capacitances of the variable capacitor 410 in association with the respective bands.

Figures 7, 8:
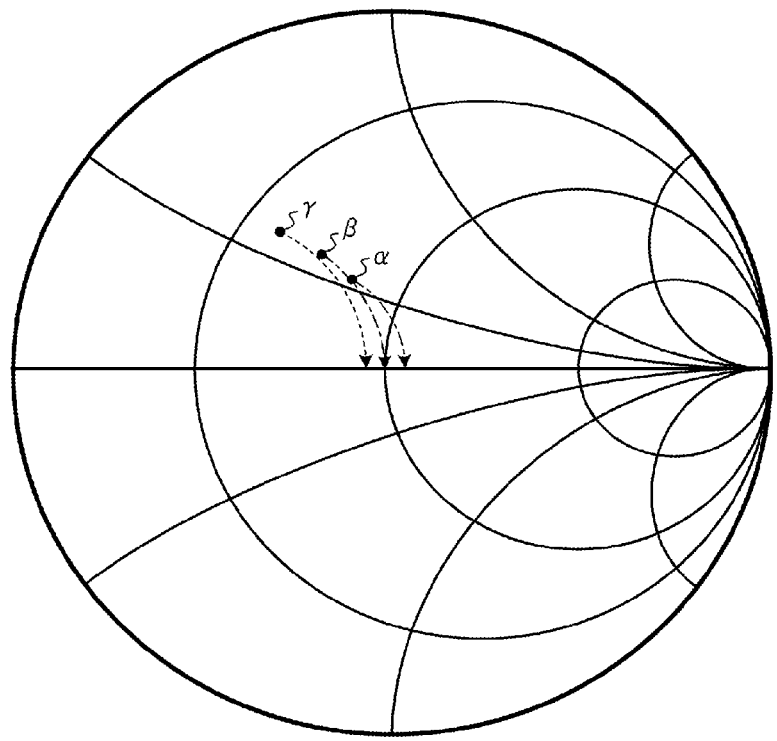
FIG. 7 is a Smith chart for describing the determination of the capacity of a variable capacitor 410.
FIG. 8 is a diagram indicating the relation between the capacitance value and applied voltage to the variable capacitor and the Smith chart with respect to the respective signals of HighBand.

Furthermore, the determination of the capacitances of the variable capacitor 410 will be described. The capacitances of the variable capacitor 410 for the respective bands of HighBand will be described. FIG. 7 is a Smith chart for describing the determination of the capacitances of the variable capacitor 410. FIG. 8 is diagram indicating the relation between the capacitance value and applied voltage to the variable capacitor and the Smith chart with respect to the respective signals of HighBand.

A case in which the impedances of each band is matched to be 50Ω will be described. Because the impedances of Band I, Band IX, and DCS/PCS are different from each other, in order to match the different impedances to be 50Ω, the capacitance of the variable capacitor 410 is changed.

If the signal having a band of Band I is output, the impedance of the amplifier 31 is at the point denoted by α in FIG. 7. Letting the capacitance value of the variable capacitor 410 be A, the impedance of the amplifier 31 at the point α in the Smith chart of FIG. 7 moves along the chain double-dashed line arrow to be matched to be 50Ω. When the applied voltage of the variable capacitor 410 is set to be 1.0 (V), the capacitance value of the variable capacitor 410 can be set to be A.

If the signal having a band of DCS/PCS is output, the impedance of the amplifier 31 is at the point denoted by β in FIG. 7. Letting the capacitance value of the variable capacitor 410 be B, the impedance of the amplifier 31 at the point β in the Smith chart of FIG. 7 moves along the dot-and-dash line arrow to be matched to be 50Ω. When the applied voltage of the variable capacitor 410 is set to be 1.5 (V), the capacitance value of the variable capacitor 410 can be set to be B.

If the signal having a band of Band IX is output, the impedance of the amplifier 31 is at the point denoted by γ in FIG. 7. Letting the capacitance value of the variable capacitor 410 be C, the impedance of the amplifier 31 at the point γ in the Smith chart of FIG. 7 moves along the dotted line arrow to be matched to be 50Ω. When the applied voltage of the variable capacitor 410 is set to be 2.0 (V), the capacitance value of the variable capacitor 410 can be set to be C.

A summary of the foregoing relations is indicated in FIG. 8. FIG. 8 indicates, corresponding to each band, the impedance of the amplifier 31 before using the variable capacitor 410 when the signal of the band is input and an applied voltage when the signal of the band is input. The impedance of the amplifier 31 in FIG. 8 is represented by a point in the Smith chart of FIG. 7. Furthermore, FIG. 8 indicates the relation between the capacitance value of the variable capacitor 410 for making each impedance 50Ω and the applied voltage for making the variable capacitor 410 have each capacitance value.

The SW controlling unit 3 stores therein the voltage applied to the variable capacitor 410 when the signal of each band indicated in FIG. 8 is input, in association with the band.

If the signal having a band of Band I is input, the SW controlling unit 3 turns on the switch 11 and switches the switch 400 to the contact 402 side. The SW controlling unit 3 turns off the switches 12, 13, 14, and 15. Furthermore, the SW controlling unit 3 applies a voltage to the variable capacitor 410 so that the variable capacitor 410 has the capacitance value A. In other words, the SW controlling unit 3 applies 1.0 (V), which is the applied voltage corresponding to Band I indicated in FIG. 8, to the variable capacitor 410.

If the signal having a band of Band IX is input, the SW controlling unit 3 turns on the switch 12 and switches the switch 400 to the contact 402 side. The SW controlling unit 3 turns off the switches 11, 13, 14, and 15. Furthermore, the SW controlling unit 3 applies a voltage to the variable capacitor 410 so that the variable capacitor 410 has the capacitance value B. In other words, the SW controlling unit 3 applies 2.0 (V), which is the applied voltage corresponding to Band IX indicated in FIG. 8, to the variable capacitor 410.

If the signal having a band of DCS/PCS is input, the SW controlling unit 3 turns on the switch 13 and switches the switch 400 to the contact 402 side. The SW controlling unit 3 turns off the switches 11, 12, 14, and 15. Furthermore, the SW controlling unit 3 applies a voltage to the variable capacitor 410 so that the variable capacitor 410 has the capacitance value C. In other words, the SW controlling unit 3 applies 1.5 (V), which is the applied voltage corresponding to DCS/PCS indicated in FIG. 8, to the variable capacitor 410.

If the signal having a band of Band V is input, the SW controlling unit 3 turns on the switch 14 and switches the switch 400 to the contact 401 side. The SW controlling unit 3 turns off the switches 11, 12, 13, and 15. Furthermore, the SW controlling unit 3 applies a voltage to the variable capacitor 410 so that the variable capacitor 410 has the capacitance value D for making the impedance of the amplifier 32 50Ω when the signal having a band of Band V is input.

If the signal having a band of GSM850/900 is input, the SW controlling unit 3 turns on the switch 15 and switches the switch 400 to the contact 401 side. The SW controlling unit 3 turns off the switches 11, 12, 13, and 14. Furthermore, the SW controlling unit 3 applies a voltage to the variable capacitor 410 so that the variable capacitor 410 has the capacitance value E for making the impedance of the amplifier 32 50Ω when the signal having a band of GSM850/900 is input.

Thus, the capacitance of the variable capacitor 410 provided between the switch 400 and the ground is changed in accordance with the band of the input signal, whereby more suitable matching is performed for each band.

Figure 9:
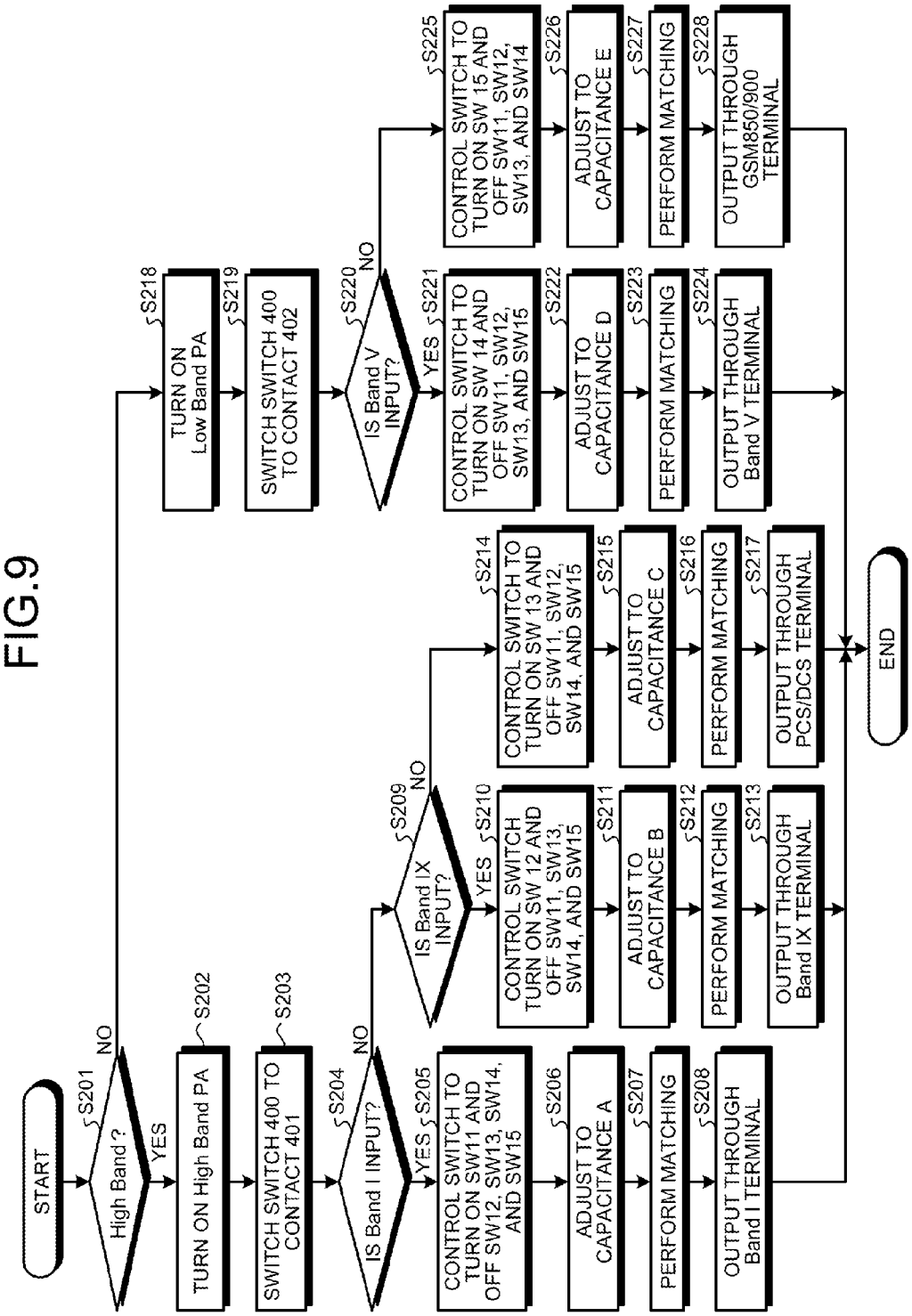
FIG. 9 is a flowchart illustrating the operation of a transmitting amplifier according to the second embodiment.

Next, with reference to FIG. 9, the operation of the transmitting amplifier according to the present embodiment during signal transmission will be described. FIG. 9 is a flowchart illustrating the operation of the transmitting amplifier of the matching circuit according to the second embodiment.

The RF-LSI 206 determines whether the band of the input wireless signal is HighBand (Step S201). If it is HighBand (Yes at Step S201), the matching circuit 2 turns on the HighBand PA 101 (Step S202).

The SW controlling unit 3 then receives the switching execution instruction for a signal having any band of Band I, Band IX, or PCS/DCS from the band switching unit 220 and switches the switch 400 to the contact 401 (Step S203).

Furthermore, the SW controlling unit 3 determines whether the signal having a band of Band I is input (Step S204). If the signal having a band of Band I is input (Yes at Step S204), the SW controlling unit 3 controls the switch 1 so that the switch 11 is turned on and that the switches 12 to 15 are turned off (Step S205).

Furthermore, the SW controlling unit 3 applies a voltage to the variable capacitor 410 to adjust its capacitance value to be A (Step S206).

The matching circuit 2 matches the output from the amplifier 31 using the coils 21 and 22, the capacitors 25 to 27, and the variable capacitor 410 whose capacitance value adjusted to be A (Step S207).

The switch 1 outputs the signal having a band of Band I output from the matching circuit 2 through the Band I terminal connecting to the signal path 212 (Step S208).

In contrast, if the signal having a band of Band I is not input (No at Step S204), the SW controlling unit 3 determines whether the signal having a band of Band IX is input (Step S209). If the signal having a band of Band IX is input (Yes at Step S209), the SW controlling unit 3 controls the switch 1 so that the switch 12 is turned on and that the switches 11, and 13 to 15 are turned off (Step S210).

Furthermore, the SW controlling unit 3 applies a voltage to the variable capacitor 410 to adjust its capacitance value to be B (Step S211).

The matching circuit 2 matches the output from the amplifier 31 using the coils 21 and 22, the capacitors 25 to 27, and the variable capacitor 410 whose capacitance value adjusted to be B (Step S212).

The switch 1 outputs the signal having a band of Band IX output from the matching circuit 2 through the Band IX terminal connecting to the signal path 213 (Step S213).

In contrast, if the signal having a band of Band IX is not input (No at Step S209), the SW controlling unit 3 controls the switch 1 so that the switch 13 is turned on and that the switches 11, 12, 14, and 15 are turned off (Step S214).

Furthermore, the SW controlling unit 3 applies a voltage to the variable capacitor 410 to adjust its capacitance value to be C (Step S215).

The matching circuit 2 matches the output from the amplifier 31 using the coils 21 and 22, the capacitors 25 to 27, and the variable capacitor 410 whose capacitance value adjusted to be C, (Step S216).

The switch 1 outputs the signal having a band of DCS/PCS output from the matching circuit 2 through the DCS/PCS terminal connecting to the signal path 215 (Step S218).

In contrast, if not HighBand (No at Step S201), the matching circuit turns on the LowBand PA 102 (Step S219).

The SW controlling unit 3 then receives the switching execution instruction for a signal having either band of Band V or GSM850/900 from the band switching unit 220 and switches the switch 400 to the contact 402 (Step S219).

Furthermore, the SW controlling unit 3 determines whether the signal having a band of Band V is input (Step S220). If the signal having a band of Band V is input (Yes at Step S220), the SW controlling unit 3 controls the switch 1 so that the switch 14 is turned on and that the switches 11 to 13, and 15 are turned off (Step S221).

Furthermore, the SW controlling unit 3 applies a voltage to the variable capacitor 410 to adjust its capacitance value to be D (Step S222).

The matching circuit 2 matches the output from the amplifier 32 using the coils 23 and 24, the capacitors 25 to 27, and the variable capacitor 410 whose capacitance value adjusted to be D (Step S223).

The switch 1 outputs the signal having a band of Band V output from the matching circuit 2 through the Band V terminal connecting to the signal path 211 (Step S224).

In contrast, if the signal having a band of Band V is not input (No at Step S220), the SW controlling unit 3 controls the switch 1 so that the switch 15 is turned on and that the switches 11 to 14 are turned off (Step S225).

Furthermore, the SW controlling unit 3 applies a voltage to the variable capacitor 410 to adjust its capacitance value to be E (Step S226).

The matching circuit 2 matches the output from the amplifier 32 using the coils 23 and 24, the capacitors 25 to 27, and the variable capacitor 410 whose capacitance value adjusted to be E (Step S227).

The switch 1 outputs the signal having a band of GSM850/900 output from the matching circuit 2 through the GSM850/900 terminal connecting to the signal path 214 (Step S228).

As described above, the final-stage matching circuit of the transmitting amplifier according to the present embodiment is a circuit in which the matching circuit for the signal of High-Band and the matching circuit for the signal of LowBand are integrated. This reduces the number of matching elements for use in performing matching and reduces the size of the matching circuit. Furthermore, the transmitting amplifier according to the present embodiment can change the impedance of the matching circuit by changing the capacitance of the variable capacitor. This leads to more suitable matching for each band than in the first embodiment. The use of this transmitting amplifier therefore provides more suitable matching for each band and contributes to the miniaturization of wireless communication terminals such as cellular phones.

[Third Embodiment] [c] Third Embodiment

Figure 10:
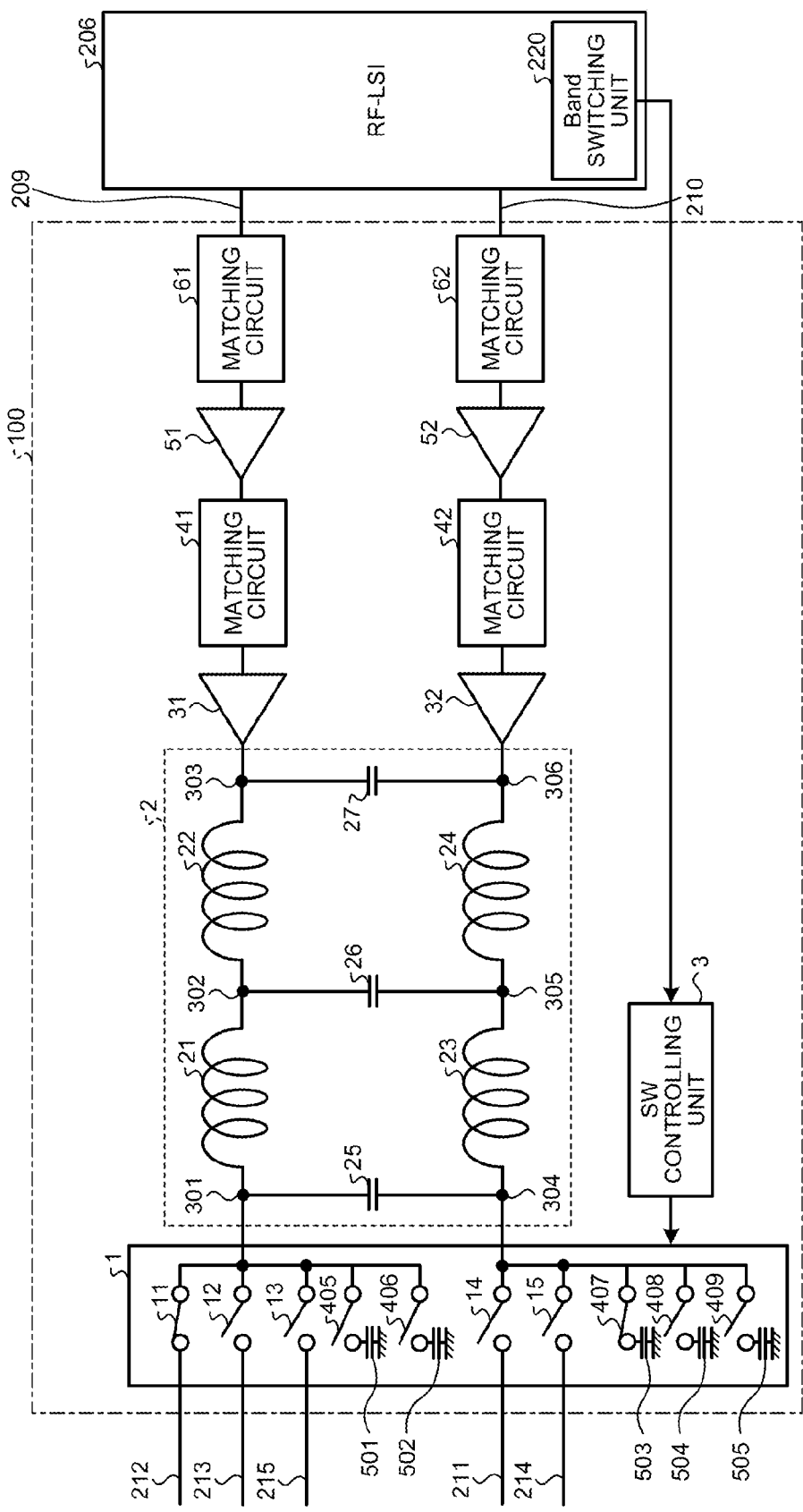
FIG. 10 is a block diagram of a transmitting amplifier according to a third embodiment.

FIG. 10 is a block diagram of a transmitting amplifier according to a third embodiment. This transmitting amplifier 100 according to the present embodiment is different from the first embodiment in that it includes, in place of the switch 400, the contact 401, and the contact 402, a switch connected to the ground through a capacitor with a different capacitance for each band. Hereinafter then, the operations of the SW controlling unit 3 and the switch 1 will be mainly described. In FIG. 10, the parts having the same reference signs as those of FIG. 1 are regarded to have the same functions unless otherwise described.

The switch 1 of the transmitting amplifier 100 according to the present embodiment includes, in addition to the switches 12 to 15, switches 405 to 409 and capacitors 501 to 505.

The switch 405 is, upon being turned on, connected to the ground through the capacitor 501. The switch 406 is, upon being turned on, connected to the ground through the capacitor 502. The switch 407 is, upon being turned on, connected to the ground through the capacitor 503. The switch 408 is, upon being turned on, connected to the ground through the capacitor 504. The switch 409 is, upon being turned on, connected to the ground through the capacitor 505.

The capacitors 501 to 505 have different capacitance values. For example, the capacitance value of the capacitor 501 is determined so that the output from the amplifier 32 can be matched when Band V is input with the switch 405 turned on. The capacitor 501 is set to have the capacitance value D. The capacitance value of the capacitor 502 is determined so that the output from the amplifier 32 can be matched when GSM850/900 is input with the switch 406 turned on. The capacitor 502 is set to have the capacitance value E. The capacitance value of the capacitor 503 is determined so that the output from the amplifier 31 can be matched when Band I is input with the switch 407 turned on. The capacitor 503 is set to have the capacitance value A. The capacitance value of the capacitor 504 is determined so that the output from the amplifier 31 can be matched when DCS/PCS is input with the switch 408 turned on. The capacitor 504 is set to have the capacitance value B. The capacitance value of the capacitor 505 is determined so that the output from the amplifier 31 can be matched when Band IX is input with the switch 409 turned on. The capacitor 505 is set to have the capacitance value C.

These capacitors 501 to 505 correspond to capacitors of different capacitances corresponding to the frequencies of an input signal.

The SW controlling unit 3 stores therein in advance the correspondence between the bands and the switches 405 to 409. For example, the SW controlling unit 3 stores therein Band I, Band IX, DCS/PCS, Band V, and GSM850/900, in correspondence with the switch 407, the switch 409, the switch 408, the switch 405, and the switch 406, respectively.

If the signal having a band of Band I is input, the SW controlling unit 3 turns on the switch 11 and turns off the switches 12, 13, 14, and 15. Furthermore, the SW controlling unit 3 turns on the switch 407 and turns off the switches 405, 406, 408, and 409.

If the signal having a band of Band IX is input, the SW controlling unit 3 turns on the switch 12 and turns off the switches 11, 13, 14, and 15. Furthermore, the SW controlling unit 3 turns on the switch 409 and turns off the switches 405 to 408.

If the signal having a band of DCS/PCS is input, the SW controlling unit 3 turns on the switch 13 and turns off the switches 11, 12, 14, and 15. Furthermore, the SW controlling unit 3 turns on the switch 408 and turns off the switches 405 to 407 and 409.

If the signal having a band of Band V is input, the SW controlling unit 3 turns on the switch 14 and turns off the switches 11, 12, 13, and 15. Furthermore, the SW controlling unit 3 turns on the switch 405 and turns off the switches 406 to 409.

If the signal having a band of GSM850/900 is input, the SW controlling unit 3 turns on the switch 15 and turns off the switches 11, 12, 13, and 14. Furthermore, the SW controlling unit 3 turn on the switch 406 and turns off the switches 405 and 407 to 409.

Thus, the capacitance of the capacitor provided between the switches and the ground is changed in accordance with the band of the input signal, whereby more suitable matching is performed for each band.

Figure 11:
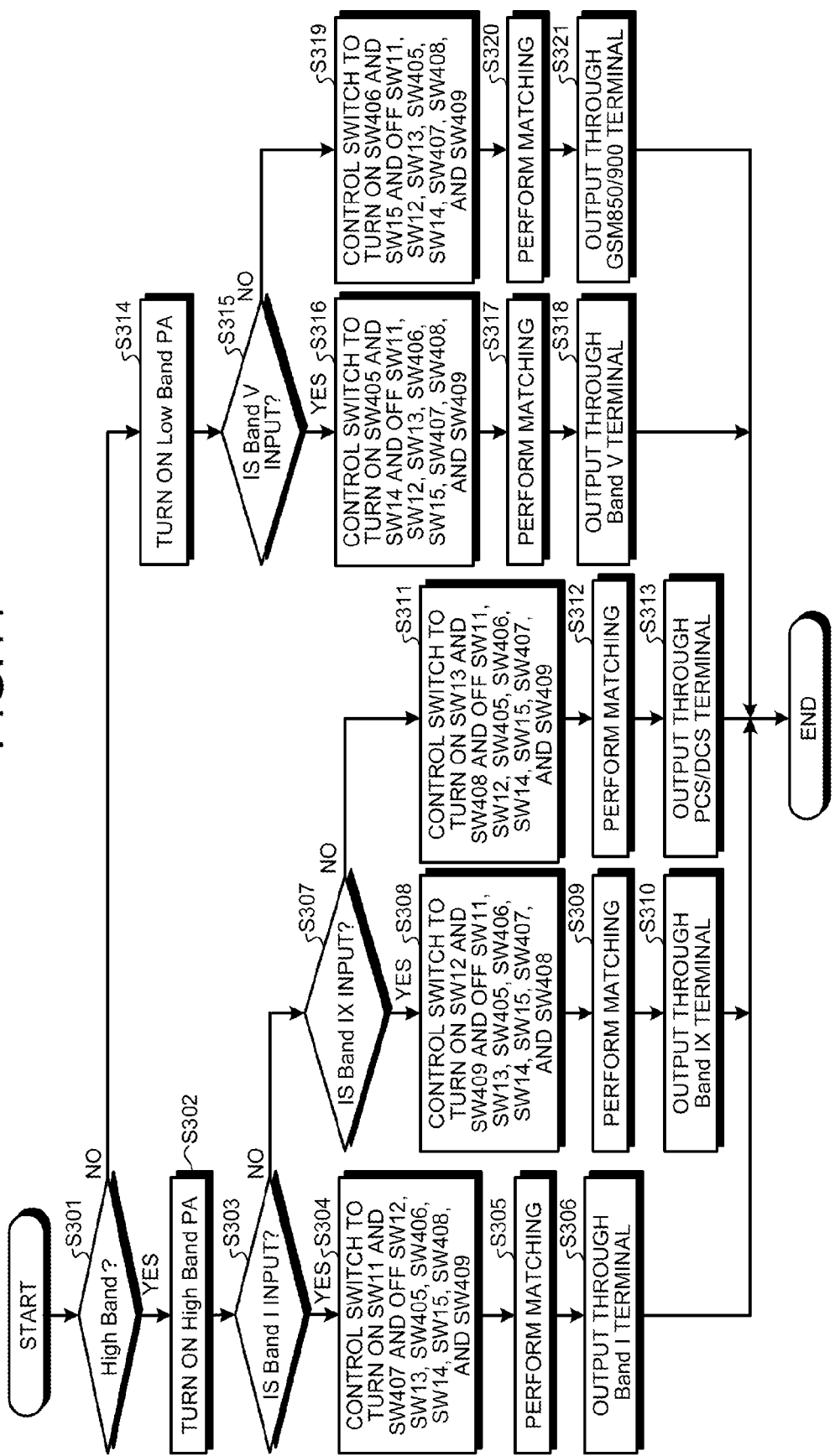
FIG. 11 is a flowchart illustrating the operation of the transmitting amplifier according to the third embodiment during signal transmission.

Next, with reference to FIG. 11, the operation of the transmitting amplifier according to the third embodiment during signal transmission will be described. FIG. 11 is a flowchart illustrating the operation of the transmitting amplifier according to the third embodiment during signal transmission.

The RF-LSI 206 determines whether the band of the input wireless signal is HighBand (Step S301). If it is HighBand (Yes at Step S301), the matching circuit 2 turns on the High-Band PA 101 (Step S302).

The SW controlling unit 3 determines whether the signal having a band of Band I is input (Step S303). If the signal having a band of Band I is input (Yes at Step S303), the SW controlling unit 3 controls the switch 1 so that the switch 11 is turned on and that the switches 12 to 15 are turned off. Furthermore, the SW controlling unit 3 controls the switch 1 so that the switch 407 is turned on and that the switch 405, the switch 406, the switch 408, and the switch 409 are turned off (Step S304).

The matching circuit 2 matches the output from the amplifier 31 using the coils 21 and 22, the capacitors 25 to 27, and the capacitor 503 (Step S305).

The switch 1 outputs the signal having a band of Band I output from the matching circuit 2 through the Band I terminal connecting to the signal path 212 (Step S306).

In contrast, if the signal having a band of Band I is not input (No at Step S303), the SW controlling unit 3 determines whether the signal having a band of Band IX is input (Step S307). IF the signal having a band of Band IX is input (Yes at Step S307), the SW controlling unit 3 controls the switch 1 so that the switch 12 is turned on and that the switches 11, and 13 to 15 are turned off. Furthermore, the SW controlling unit 3 controls the switch 1 so that the switch 409 is turned on and that the switches 405 to 408 are turned off (Step S308).

The matching circuit 2 matches the output from the amplifier 31 using the coils 21 and 22, the capacitors 25 to 27, and the capacitor 505 (Step S309).

The switch 1 outputs the signal having a band of Band IX output from the matching circuit 2 through the Band IX terminal connecting to the signal path 213 (Step S310).

In contrast, if the signal having a band of Band IX is not input (No at Step S307), the SW controlling unit 3 controls the switch 1 so that the switch 13 is turned on and that the switches 11, 12, 14, and 15 are turned off. Furthermore, the SW controlling unit 3 controls the switch 1 so that the switch 408 is turned on and that the switches 405 to 407 and 409 are turned off (Step S311).

The matching circuit 2 matches the output from the amplifier 31 using the coils 21 and 22, the capacitors 25 to 27, and the capacitor 504 (Step S312).

The switch 1 outputs the signal having a band of DCS/PCS output from the matching circuit 2 through the DCS/PCS terminal connecting to the signal path 215 (Step S313).

In contrast, if not HighBand (No at Step S301), the matching circuit 2 turns on the LowBand PA 102 (Step S314).

Furthermore, the SW controlling unit 3 determines whether the signal having a band of Band V is input (Step S315). If the signal having a band of Band V is input (Yes at S315), the SW controlling unit 3 controls the switch 1 so that the switch 14 is turned on and that the switches 11 to 13, and 15 are turned off. Furthermore, the SW controlling unit 3 controls the switch 1 so that the switch 405 is turned on and that the switches 406 to 409 are turned off (Step S316).

The matching circuit 2 matches the output from the amplifier 32 using the coils 23 and 24, the capacitors 25 to 27, and the capacitor 501 (Step S317).

The switch 1 outputs the signal having a band of Band V output from the matching circuit 2 through the Band V terminal connecting to the signal path 211 (Step S318).

In contrast, if the signal having a band of Band V is not input (No at Step S315), the SW controlling unit 3 controls the switch 1 so that the switch 15 is turned on and that the switches 11 to 14 are turned off. Furthermore, the SW controlling unit 3 controls the switch 1 so that the switch 406 is turned on and that the switches 405, and 407 to 409 are turned off (Step S319).

The matching circuit 2 matches the output from the amplifier 32 using the coils 23 and 24, the capacitors 25 to 27, and the capacitor 502 (Step S320).

The switch 1 outputs the signal having a band of GSM850/900 output from the matching circuit 2 through the GSM850/900 terminal connecting to the signal path 214 (Step S321).

As described above, the final-stage matching circuit of the transmitting amplifier according to the present embodiment is a circuit in which the matching circuit for the signal of HighBand and the matching circuit for the signal of LowBand are integrated. This reduces the number of matching elements for use in performing matching and reduces the size of the matching circuit. Furthermore, the transmitting amplifier according to the present embodiment can change the capacitance between switches and the ground by changing the switches, thereby changing the impedance of the matching circuit. More suitable matching can be thereby performed for each band than in the first embodiment. The use of this transmitting amplifier therefore provides more suitable matching for each band and contributes to the miniaturization of wireless communication terminals such as cellular phones.

In the above description, the input side matching circuit has the two independent matching circuits for HighBand and LowBand. However, because the setting is not difficult for the input side matching circuit, they can be easily integrated as in conventional techniques. For this reason, even when the input side matching circuits are integrated in the embodiments, the final-stage matching circuit and the switches according to the embodiments can operate to provide the same effect.

In the above-described embodiments, the final-stage matching circuit locates coils in series on the respective signal paths and connects the ends of the coils on the respective signal paths with capacitors. However, the coils and the capacitors may be interchanged. In other words, the capacitors may be located in series in the respective signal paths, and the ends of the capacitors on the respective signal paths may be connected with the coils.

In the above-described embodiments, a plurality of coils are located in series on the signal path. Even in a case in which the number of coils is one, the devices according to the embodiments can operate to provide the same effect. The same holds true for the above-described case in which the coils and the capacitors are interchanged.

REFERENCE SIGNS LIST

An embodiment of a matching device, a transmitting amplifier, and a wireless communication device disclosed by the present invention provides an effect of reducing the size of an output side matching circuit in a wireless communication device.

What is claimed is:

1. A matching device comprising:
   a first signal path that has one or a plurality of first matching elements arranged in series, the first matching elements being connected to an output of a first amplifier;
   a second signal path that has the same number of second matching elements as the first matching elements, the second matching elements having the same type of reactance as the first matching elements and being arranged in series and connected to an output of a second amplifier;
   a plurality of coupling paths that have third matching elements having a different type of reactance from the first matching elements and couple the first signal path and the second signal path at both ends of the respective first matching elements on the first signal path and of the corresponding second matching elements on the second signal path;
   a switch that switches connection of the first signal path to an antenna or a ground and switches connection of the second signal path to the antenna or the ground; and
   a switch controlling unit that controls the switch so as to connect the second signal path to the ground when a signal is input from the first amplifier and that controls the switch so as to connect the first signal path to the ground when a signal is input from the second amplifier.

2. The matching device according to claim 1, wherein
   the switch has a plurality of paths having a plurality of capacitors of different capacitances corresponding to a frequency of an input signal as paths for connecting a plurality of output paths of the first amplifier and the second amplifier to the ground, and
   the switch controlling unit switches the switch to a path corresponding to the frequency of a signal input to the first amplifier or the second amplifier.

3. The matching device according to claim 1, wherein
the switch has a variable capacitance element on a path for connecting a plurality of output paths of the first amplifier and the second amplifier to the ground, and
the switch controlling unit changes the capacitance of the variable capacitance element in accordance with the frequency of a signal input to the first amplifier or the second amplifier.

4. The matching device according to claim 1, wherein a third amplifier is located at an input side of the first amplifier and a fourth amplifier is located at an input side of the second amplifier.

5. The matching device according to claim 1, wherein a signal having a higher frequency than the frequency of a signal input to the first amplifier is input to the second amplifier.

6. A transmitting amplifier comprising:
a first amplifier that amplifies an input signal;
a second amplifier that receives a signal of a higher frequency than the signal input to the first amplifier and amplifies the signal;
a first signal path that has one or a plurality of first matching elements arranged in series, the first matching elements being connected to an output of the first amplifier;
a second signal path that has the same number of second matching elements as the first matching elements, the second matching elements having the same type of reactance as the first matching elements and being arranged in series and connected to an output of the second amplifier;
a plurality of coupling paths that have third matching elements having a different type of reactance from the first matching elements and couple the first signal path and the second signal path at both ends of the respective first matching elements on the first signal path and the corresponding second matching elements on the second signal path;
a switch that switches connection of the first signal path to an antenna or a ground and switches connection of the second signal path to the antenna or the ground; and
a switch controlling unit that controls the switch so as to connect the second signal path to the ground when a signal is input from the first amplifier and that controls the switch so as to connect the first signal path to the ground when a signal is input from the second amplifier.

7. A wireless communication device comprising:
a baseband signal generating unit that generates a baseband signal based on input data;
a wireless signal generating unit that changes the baseband signal into a wireless signal;
a first amplifier that amplifies the signal received from the wireless signal generating unit;
a second amplifier that receives the input of a signal of a higher frequency than the signal input to the first amplifier from the wireless signal generating unit and amplifies the signal;
a first signal path that has one or a plurality of first matching elements arranged in series, the first matching elements being connected to an output of the first amplifier;
a second signal path that has the same number of second matching elements as the first matching elements, the second matching elements having the same type of reactance as the first matching elements and being arranged in series and connected to an output of the second amplifier;
a plurality of coupling paths that have third matching elements having a different type of reactance from the first matching elements and couple the first signal path and the second signal path at both ends of the respective first matching elements on the first signal path and of the corresponding second matching elements on the second signal path;
a switch that switches connection of the first signal path to an antenna or a ground and switches connection of the second signal path to the antenna or the ground;
a switch controlling unit that controls the switch so as to connect the second signal path to the ground when a signal is input from the first amplifier and that controls the switch so as to connect the first signal path to the ground when a signal is input from the second amplifier; and
a transmitting unit that transmits the signal output from the first signal path or the second signal path through the corresponding antenna.

* * * * *